US006853062B1

(12) United States Patent
Saito

(10) Patent No.: US 6,853,062 B1
(45) Date of Patent: Feb. 8, 2005

(54) SINGLE SUBSTRATE HYDROGEN AND MICROWAVE ABSORBER FOR INTEGRATED MICROWAVE ASSEMBLY AND METHOD OF MANUFACTURING SAME

(75) Inventor: Yoshio Saito, Westchester, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 10/725,271

(22) Filed: Dec. 2, 2003

(51) Int. Cl.[7] ................................................ H01L 23/20
(52) U.S. Cl. ........................ 257/682; 257/728; 438/471
(58) Field of Search ................................ 257/682, 275, 257/482, 604, 728, 704; 438/58, 143, 402, 471

(56) References Cited

U.S. PATENT DOCUMENTS 6,369,442 B1 * 4/2002 Saito .......................... 257/682
6,548,889 B2 * 4/2003 Saito .......................... 257/682
6,703,701 B2 * 3/2004 Baudet et al. .............. 257/682
2004/0023058 A1 * 2/2004 Kovacs et al. .............. 428/626
2004/0106001 A1 * 6/2004 Kovacs et al. .............. 428/670

* cited by examiner

*Primary Examiner*—S. V. Clark
(74) *Attorney, Agent, or Firm*—Posz & Bethards, PLC

(57) ABSTRACT

A single substrate hydrogen and microwave absorber (20) attenuates spurious microwave signals in a metal Integrated Microwave Assembly (10, 10') and reduces hydrogen poisoning of hydrogen sensitive components implemented in the Integrated Microwave Assembly (10, 10'). The single substrate hydrogen and microwave absorber (20) includes a titanium substrate (30) with channels (32) spaced apart from one another by a predetermined distance. A layer of microwave absorbing material (34) is formed on portions (35) of the titanium substrate (30) between the channels (32), and a layer of hydrogen getting material (36) is formed in the channels (32) of the titanium substrate (30).

23 Claims, 4 Drawing Sheets

SINGLE SUBSTRATE HYDROGEN AND MICROWAVE ABSORBER FOR INTEGRATED MICROWAVE ASSEMBLY AND METHOD OF MANUFACTURING SAME

FIELD OF THE INVENTION

The present invention relates generally to integrated microwave assemblies, and more particularly to a single substrate hydrogen and microwave absorber for an integrated microwave assembly.

BACKGROUND

Microwave packages and modules, such as Integrated Microwave Assemblies (IMAs), typically include iron-based alloys or aluminum composites and plated layers that contain hydrogen as a result of the manufacturing process. Usually, the hydrogen will outgas and not present a problem. However, in a hermetically sealed package, hydrogen can reach as high as a few percent. Hydrogen causes degradation, or poisoning, of some types of GaAs devices over a wide range of partial pressures, with such poisoning resulting in a sudden and dramatic change in device electrical performance after several hundred to several thousand hours of hydrogen exposure at elevated temperatures.

Hydrogen poisoning of high electronic mobility transistor (HEMT) and metal semiconductor field effect transistor (MESFET) devices used in the above mentioned IMAs is a major reliability issue. Many materials used in the manufacturing and/or assembly of IMAs such as, for example, Ni and Au plated Kovar™ or A40, and even some RF absorber materials, are known to outgas hydrogen. A number of conventional options for dealing with this problem include eliminating or minimizing the hydrogen source, changing device technology, using an in-package hydrogen getter, and compensating for device electrical changes through circuit design.

Eliminating or minimizing the hydrogen source can be accomplished to a certain extent by vacuum baking the package parts or choosing low hydrogen soluble materials. However, it is difficult to completely eliminate all hydrogen-bearing materials. An alternate approach is to modify the device technology with the use of a gate metal, such as Tiw that is more hydrogen insensitive. While this may be an adequate approach for a relatively new technology, changing processes in relatively mature industries, which have a heritage of use and field experience, is not usually favorable.

A more desirable method is to use an in-package hydrogen getter to reduce hydrogen partial pressures to safe levels. The use of hydrogen getters in semiconductor packaging is common, and there are several commercially available hydrogen getters that can be employed in microwave packaging.

RF instability due to reflections from the metal IMA chassis and the back-scattering of microwaves inside the IMA is another major problem in microelectronic technology today, especially in high frequency/high gain MMIC devices. Microwave absorbers, also known as lossy materials or high loss tangent, help eliminate radio frequency (RF) instabilities due to microwave reflections inside the cavities of the IMAs of the microwave devices they support. Such reflections within the IMA chassis lead to wave—wave microwave iterations, which result in unwanted microwave signals. The absorbers function much like a band-pass filter as they absorb unwanted signals, and pass desired signals through the IMA. Commercially available microwave absorbers include such brands as Eccosorb™.

Microwave absorbers achieve absorption by significantly reducing the reflective properties of the metal structures of the IMA due to the flow of microwave currents on the surface where they are placed, dampening the cavity resonances of the microwave modules. This results in the isolation, attenuation and/or modification of the radiating patterns of the microwave devices, eliminating undesired RF instability.

While hydrogen getters and microwave absorbers are commercially available, they are individual components and require a larger footprint inside the IMAs. Examples of material used in commercially available hydrogen getters/absorbers include palladium oxides and titanium platinum or titanium palladium metals. The trend in microwave technologies today is to place a growing number of microwave devices in enclosures with ever decreasing dimensions, requiring increased component protection in a limited space. It is often impractical or impossible to add the required protection in the chassis with microwave absorbers and hydrogen getters in their current format due to limited space in IMA designs.

Furthermore, there is an additional cost for purchasing two separate products for the protection of microwave circuitry, raising the cost to both manufacturers and end users alike.

Additionally, due to space constraints, separate components will have a decreased capacity to limit hydrogen and microwave degradation relative to more appropriately sized components.

SUMMARY OF THE INVENTION

Accordingly, the present invention provides a single substrate hydrogen and microwave absorber that provides increased component protection in a small, low cost package for use in Integrated Microwave Assemblies, and a method of manufacturing the same.

The single substrate hydrogen and microwave absorber includes a titanium substrate, channels etched into the titanium substrate, a layer of microwave absorbing material formed on portions of the titanium substrate between the channels of the titanium substrate, and a layer of hydrogen getting material formed in the channels.

The channels in the titanium substrate increase the substrate surface area, and therefore the hydrogen getting capacity, of the single substrate hydrogen and microwave absorber. The microwave absorbing material, which may be a ferromagnetic material, disrupts the microwave RF signals as they propagate over the surfaces of the IMA and attenuate unwanted microwave RF signals within or external to the IMA.

The hydrogen getting material is formed in the etched channels. Examples of hydrogen getting material include palladium or platinum. The hydrogen getting material catalytically splits the hydrogen molecules into hydrogen atoms. These atoms then combine with the titanium substrate to form $TiH_x$, which is harmless to hydrogen sensitive components within the IMA.

A method of fabricating the above single substrate hydrogen and microwave absorber includes forming the channels in a titanium substrate, forming the microwave absorbing material on portions of the titanium substrate between the channels, and depositing the hydrogen absorbing material in the channels. Specifically, according to one embodiment, the channels formed in the titanium substrate are formed by first applying a photoresist pattern to the substrate, and then drying, exposing and developing the photoresist pattern. Next, the channels are etched into the titanium substrate. The photoresist pattern is removed and the titanium substrate is cleaned. A microwave absorbing material such as a ferromagnetic material is then screen printed on the portion of the titanium substrate between the channels. The titanium substrate is dried and fired to the proper temperature so that the ferromagnetic material is bonded to the titanium substrate.

To bond the hydrogen getting material to the titanium substrate, the ferromagnetic material is covered with a photoresist pattern to protect it from the application of the hydrogen getting material. The channels are next cleaned with an oxide etching process to remove any foreign bodies. A hydrogen getting material, such as palladium, is sputtered in the channels. The palladium is then lifted off the ferromagnetic material to complete the manufacturing process.

BRIEF DESCRIPTION OF THE DRAWINGS

The accompanying figures, where like reference numerals refer to identical or functionally similar elements throughout the separate views and which together with the detailed description below, are incorporated in and form part of the specification, serve to further illustrate various embodiments and to explain various principles and advantages all in accordance with the present invention.

DETAILED DESCRIPTION OF THE PREFERRED EMBODIMENTS

Figure 1:
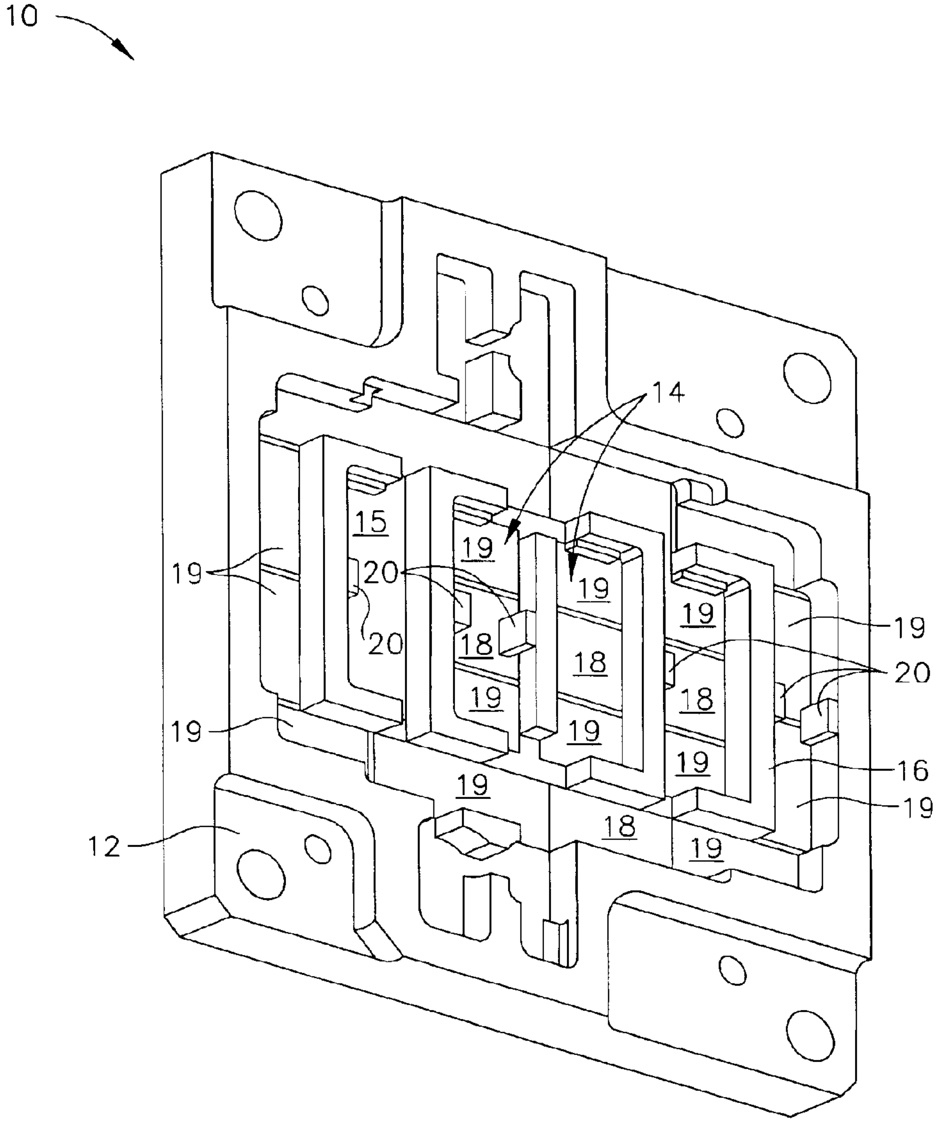
FIG. 1 is an isometric view of an exemplary Integrated Microwave Assembly of the type in which single substrate hydrogen and microwave absorbers according to the present invention are implemented.

Referring now to the drawings in which like numbers reference like components, and in which a single reference number may be used to identify an exemplary one of multiple like components, FIG. 1 shows an exemplary Integrated Microwave Assembly (IMA) 10. The IMA 10 includes a metal housing 12 that is preferably formed from a lightweight metal such as A40, cavity channels 14 defined by cavity floors 15, side walls 16 and an IMA enclosure lid 17 (FIG. 2), as well as various active components mounted therein such as, for example, Microwave Monolithic Integrated Circuit (MMICs) 18 with High Electron Mobility Transistors (HEMTs), Metal Semiconductor Field Effect Transistors (MESFETs), thin film resistors, and the like, all of which are located on an alumina substrate 19 formed on the metal housing 12. Most or all of the above MMIC components are typically susceptible to hydrogen poisoning when exposed to high amounts of hydrogen, typically in the range of about 0.01–2% of the total hydrogen holding capacity of the IMA 10. The metal housing 12 also includes single substrate hydrogen and microwave absorbers 20 of the type according to the present invention.

Figure 2:
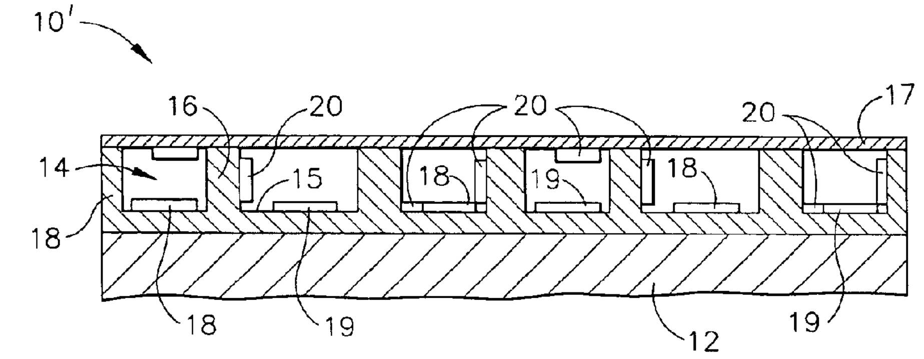
FIG. 2 is a cross-sectional view of another exemplary Integrated Microwave Assembly including single substrate hydrogen and microwave absorbers according to the present invention are implemented.

Referring to FIG. 2, a cross-sectional view of another exemplary IMA 10' similar to the IMA 10 in FIG. 1 but simplified for purposes of the present discussion is shown. The IMA 10' is shown along with an IMA enclosure lid 17 that, together with the metal housing 12, the cavity floors 15 and the cavity side walls 16 define the cavity channels 14.

FIG. 2 also shows that the single substrate hydrogen and microwave absorbers 20 are formed from chips that may be cut and sized on an application specific basis, and may be located throughout the IMA 10' to absorb hydrogen outgassed from the metal chassis of the IMA 10' and to attenuate spurious, unwanted microwave RF signals generated by the amplification by the IMA 10' of input microwave RF signals. The actual number of single substrate hydrogen and microwave absorbers used within the IMA 10' will vary on an application by application basis, as the single substrate hydrogen and microwave absorbers 20 can be sized and placed according to specific operating requirements of the IMA 10'.

Figure 3A:
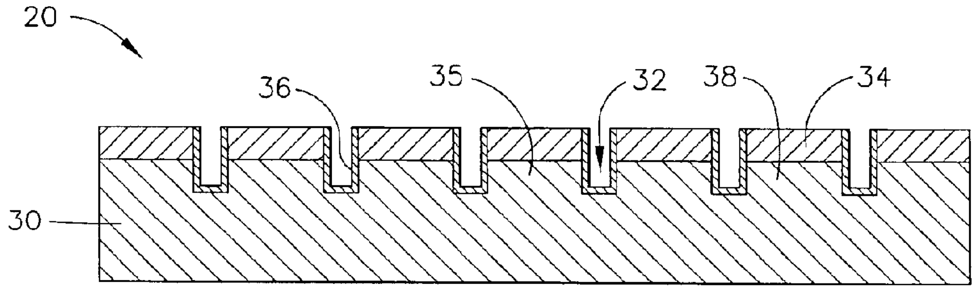
FIG. 3A is a side elevation view of an exemplary one of the single substrate hydrogen and microwave absorbers shown in FIG. 2.
Figure 3B:
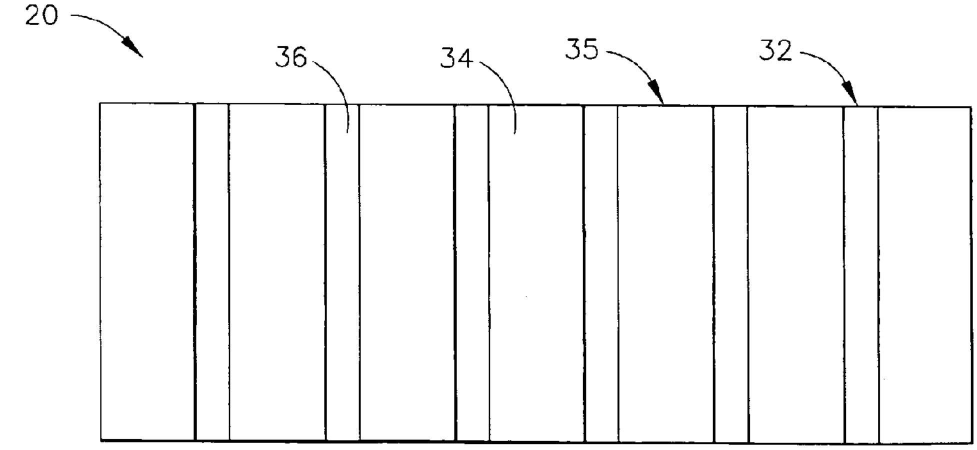
FIG. 3B is a top plan view of the single substrate hydrogen and microwave absorber shown in FIG. 3A.

FIGS. 3A and 3B show an exemplary one of the single substrate hydrogen and microwave absorbers 20 shown in FIGS. 1 and 2. The single substrate hydrogen and microwave absorber 20 includes a titanium substrate 30, channels 32 in the titanium substrate 30, a layer of microwave absorbing material 34 on portions 35 of the titanium substrate 30 between the channels 32, and a layer of hydrogen getting material 36 in the channels 32.

The layer of microwave absorbing material 34 on the titanium substrate 30 attenuates spurious microwave RF signals within and external to the metal IMA 10' that cause instabilities due to reflections and wave—wave interactions between radiated RF signals from the MMICs 18 (FIG. 1). More specifically, as the microwave RF signals are amplified by the MMICs 18 and propagate through the cavity channels 14, they generate the spurious microwave RF signals in the metal housing 12, cavity channels 14, cavity floors 15, side walls 16, and the IMA enclosure lid 17. The layer of microwave absorbing material 34, which is preferably a ferromagnetic material, must be very lossy and magnetic in nature.

To effectively attenuate unwanted RF signals, the single substrate hydrogen and microwave absorber 20 must be in the line of sight of the spurious microwave RF signals. In other words, the single substrate hydrogen and microwave absorber 20 must be located on the surface over which the spurious microwave RF signals are traveling in order to disrupt and absorb the signals and is attached by laser welding. The microwave absorbing material 34 draws the RF current generated in the metal housing 12, cavity channels 14, cavity floors 15, side walls 16 and the IMA enclosure lid 17 to consequently produce magnetic fields that attenuate the spurious microwave RF signals.

The layer of hydrogen getting material 36 in the channels 32 are preferably bonded to the cavity side walls 16 as well as to the cavity floors 15. The hydrogen getting material 36 in the channels 32 catalytically splits hydrogen molecules released from the metal housing 12, cavity channels 14, cavity floors 15, side walls 16 and the IMA enclosure lid 17 into hydrogen atoms. The hydrogen atoms are then free to diffuse into the titanium substrate 30 and to combine with the titanium in the titanium substrate 30 to form hydrides that are inert with respect to the hydrogen sensitive components in the IMA 10'. Specifically, the hydrogen atoms combine with the titanium atoms to create an inert hydride such as, for example, $TiH_x$.

The single substrate hydrogen and microwave absorber 20 according to one specific embodiment of the present invention is sized as follows. The titanium substrate 30 has a length of approximately 1 cm, a width of approximately 0.4 cm and a height of approximately 0.025 cm, where the height is defined as a total thickness of the titanium substrate 30 and the layer of microwave absorbing material 34. The associated footprint of the single substrate hydrogen and microwave absorber 20 is approximately 0.1 $cm^3$, and the total weight of the titanium substrate 30, the layer of microwave absorbing material 34 and the layer of the hydrogen getting material 36 is approximately 0.045 gm. Based on the associated footprint noted above, the titanium substrate 30 includes approximately $5.7 \times 10^{20}$ titanium atoms available for hydrogen absorption by combining with catalytically split hydrogen atoms. These available titanium atoms allow for the absorption of approximately 1000 times the number of hydrogen molecules released within a conventional IMA during burn-in and typical operations.

Referring to FIGS. 4A–G, a method of manufacturing the single substrate hydrogen and microwave absorber 20 will now be described.

Figure 4A:
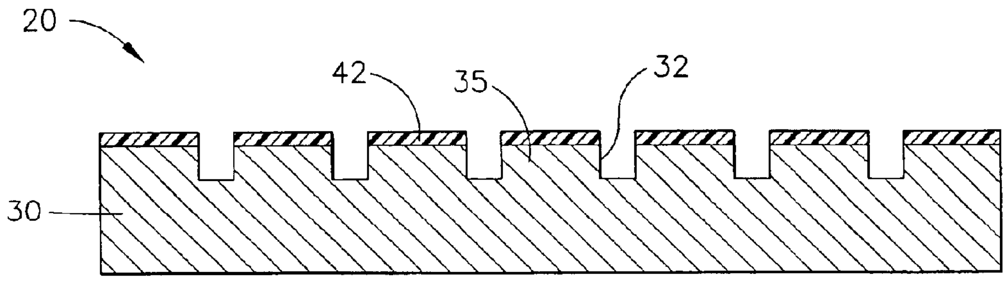
FIGS. 4A–4G are side elevation views of the single substrate hydrogen and microwave absorber of the present invention at progressive manufacturing stages.

Referring to FIG. 4A, the titanium substrate 30 is cleaned and prepared for processing prior to the channels 32 being formed. A photoresist pattern 42 is applied to the titanium substrate 30, then dried, exposed and developed to protect the portions 35 of the titanium substrate 30 between the channels 32 from the etching process. The channels 32 are then etched in the titanium substrate 30, the photoresist pattern 42 is removed and the titanium substrate 30 is cleaned. The channels 32 in the titanium substrate 30 are preferably etched by a conventional chemical etching process, such as an isotropic oxide etching process, which is capable of creating channels that are approximately 0.003 inches deep and approximately 0.005–0.006 inches wide. The channels 32 are formed to increase the surface area available on the titanium substrate 30 for depositing the hydrogen getting material 36 and to thereby increase the hydrogen absorption capacity of the single substrate hydrogen and microwave absorber 20.

Figure 4B:
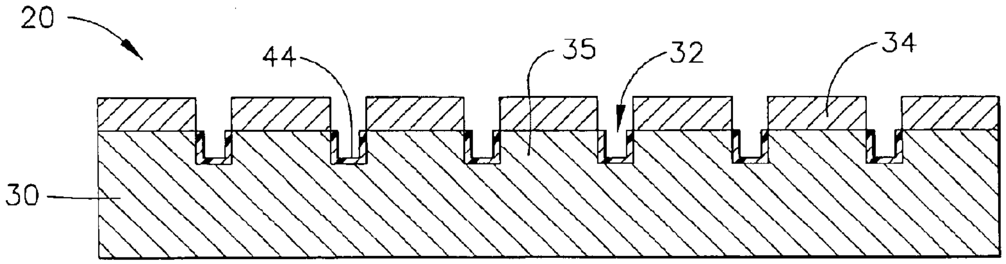

Referring to FIG. 4B, the layer of microwave absorbing material 34 is formed on the portions 35 of the substrate between the channels 32 preferably by a screen printing process. A layer of anti-bonding material 44 is applied to the bottom and sides of each of the channels 32 prior to forming the layer of microwave absorbing material 34 on the portions 35 of the titanium substrate 30 between the channels 32 to prevent the layer of microwave absorbing material 34 from bonding in the channels 32. The screen printed layer of microwave absorbing material 34 is then applied to the titanium substrate 30.

Figure 4C:
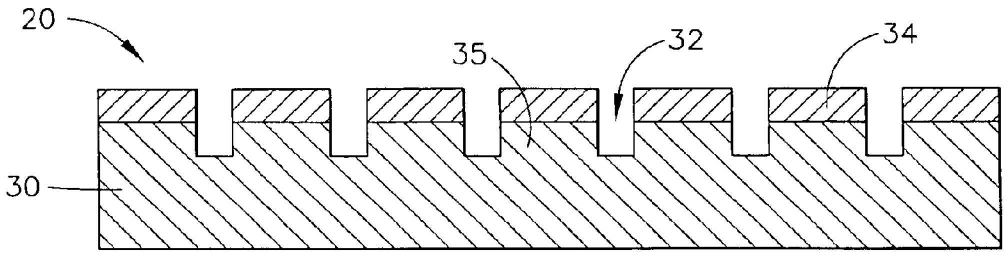

Referring to FIG. 4C, the screen printed layer of microwave absorbing material 34 is then dried on the portions 35 of the titanium substrate 30 between the channels 32. The anti-bonding material 44 is removed from the channels 32. The screen printed layer of the microwave absorbing material 34 is then fired to bond it to the portions 35 of the titanium substrate 30 between the channels 32.

Figure 4D:
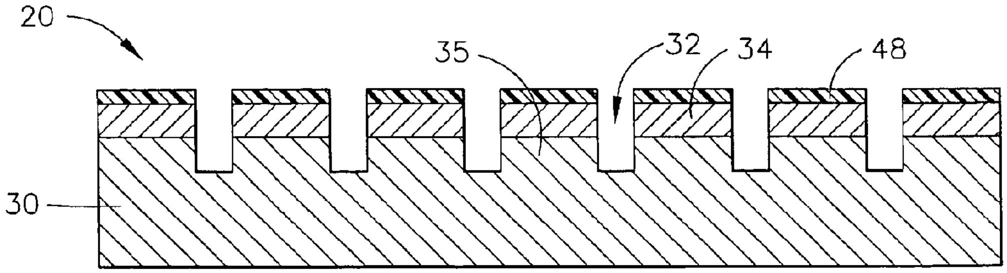
Figure 4E:
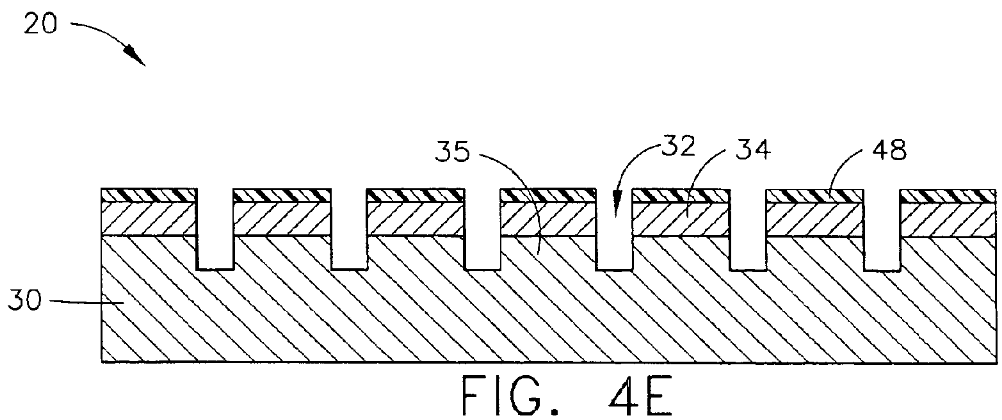

Referring to FIG. 4D, preparation is then made to form the layer of hydrogen getting material 36 in the channels 32 of the single substrate hydrogen and microwave absorber 20. Exemplary materials that may be used to form the layer of hydrogen getting material include palladium or platinum. The layer of microwave absorbing material 34 is covered with a photoresist pattern 48 to protect it during application of the layer of hydrogen getting material 36. As shown in FIG. 4E, the channels 32 are then cleaned by an oxide etching process to prepare for the application of the layer of hydrogen getting material 36.

Figure 4F:
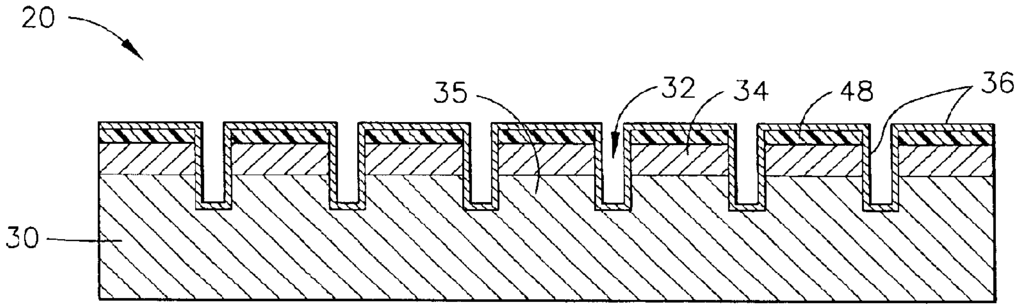

Referring to FIG. 4F, the layer of hydrogen getting material 36 is formed in the channels 32 of the titanium substrate 30. The layer of hydrogen getting material 36 may by formed by, for example, sputtering palladium or platinum over the titanium substrate 30 to form a hydrogen getting material layer that is approximately 0.1 $\mu$m thick.

Figure 4G:
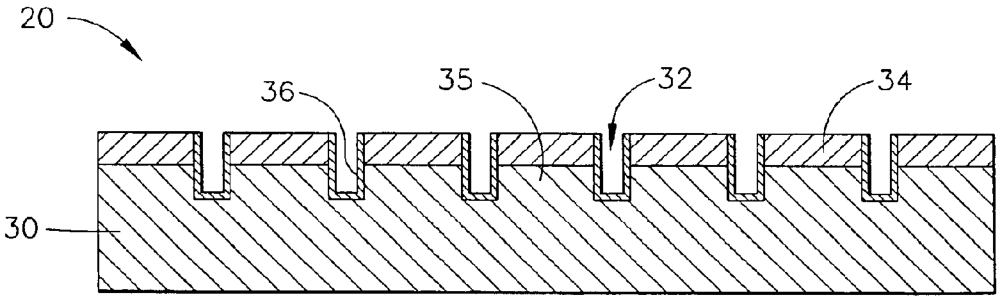

As shown in FIG. 4G, the layer of hydrogen getting material 36 and the photoresist pattern 48 are then removed from the layer of the microwave absorbing material 34 on the portions 35 of the titanium substrate 30 between the channels 32 to complete the manufacturing process.

As should now be appreciated in view of the foregoing, the single substrate hydrogen and microwave absorber 20 combines the functionality of discrete hydrogen getters and microwave absorbers in a single form factor. Combining both features in a single form factor creates a smaller footprint inside the IMA and allows for more efficient and flexible placement options to reduce hydrogen poisoning and microwave absorption. The single substrate hydrogen and microwave absorber can be customized to fit any application. The creation of channels in the titanium substrate increases the hydrogen getting capacity and increases the protection of high gain, high frequency amplifier components in IMAs. Additionally, since one component is used instead of two, IMA cost is reduced.

The present examples and embodiments are to be considered as illustrative and not restrictive and the invention is not to be limited to the details given herein, but may be modified within the scope and equivalence of the appended claims.

What is claimed is:

1. A single substrate hydrogen and microwave absorber for attenuating unwanted microwave signals in a metal Integrated Microwave Assembly (IMA) and reducing hydrogen poisoning of hydrogen sensitive components implemented in the IMA, the single substrate hydrogen and microwave absorber comprising:

a titanium substrate;

channels formed in the titanium substrate and spaced apart from one another by a predetermined distance;

a layer of microwave absorbing material formed on portions of the titanium substrate between the channels; and a layer of hydrogen getting material formed in the channels of the titanium substrate.

2. The single substrate hydrogen and microwave absorber of claim 1, wherein the layer of microwave absorbing material formed on the portions of the titanium substrate between the channels comprises a layer of magnetic material for dissipating spurious internal radio frequency (RF) signals.

3. The single substrate hydrogen and microwave absorber of claim 1, wherein the layer of microwave absorbing material formed on the portions of the titanium substrate between the channels comprises a layer of magnetic material for dissipating spurious external radio frequency (RF) signals.

4. The single substrate hydrogen and microwave absorber of claim 3, wherein the layer of magnetic material for dissipating spurious external radio frequency (RF) signals has a thickness within a range of approximately 0.001–0.002 inches.

5. The single substrate hydrogen and microwave absorber of claim 1, wherein the hydrogen getting material formed in the channels of the titanium substrate comprises a material for catalytically splitting hydrogen molecules released from the IMA into hydrogen atoms.

6. The single substrate hydrogen and microwave absorber of claim 5, wherein the titanium substrate is for reacting with the hydrogen atoms to create titanium hydrides that are inert with respect to the hydrogen sensitive components implemented in the IMA.

7. The single substrate hydrogen and microwave absorber of claim 5, wherein each of the channels comprises:

a pair of opposed channel walls that are approximately 0.003–0.005 inches deep; and a channel floor between the pair of opposed side walls that is approximately 0.006–0.010 inches wide.

8. The single substrate hydrogen and microwave absorber of claim 1, wherein the titanium substrate is approximately 0.010 inches thick.

9. The single substrate hydrogen and microwave absorber of claim 1, wherein the titanium substrate has a length of approximately 1 cm and a width of approximately 0.4 cm, and a combination of the titanium substrate and the layer of microwave absorbing material has a height of approximately 0.025 cm.

10. The single substrate hydrogen and microwave absorber of claim 1, wherein the single substrate hydrogen and microwave absorber has an associated volume of approximately 0.01 $cm^3$.

11. The single substrate hydrogen and microwave absorber of claim 1, wherein a total weight of the titanium substrate, the layer of microwave absorbing material and the layer of hydrogen getting material is approximately 0.045 gm.

12. The single substrate hydrogen and microwave absorber of claim 1, wherein the titanium substrate includes approximately $5.7\times10^{20}$ titanium atoms available for hydrogen absorption.

13. A method of fabricating a single substrate hydrogen and microwave absorber for attenuating unwanted microwave signals in a metal Integrated Microwave Assembly (IMA) and for reducing hydrogen poisoning of hydrogen sensitive components implemented in the IMA (IMA), comprising:

forming channels in a single titanium substrate;

forming a layer of microwave absorbing material on portions 35 of the titanium substrate between the channels; and depositing a layer of hydrogen getting material in the channels.

14. The method of claim 13, wherein the forming of the channels in the single substrate hydrogen and microwave absorber comprises forming the channels through isotropic chemical etching.

15. The method of claim 13, wherein the forming of the layer of microwave absorbing material on the portions of the titanium substrate between the channels comprises screen printing said microwave absorbing material on portions of the titanium substrate between the channels.

16. The method of claim 13, further comprising applying an anti-bonding material to the channels prior to the forming of a layer of microwave absorbing material on portions of the titanium substrate between the channels to prevent the layer of microwave absorbing material from bonding in the channels.

17. The method of claim 15, wherein the forming of the layer of microwave absorbing material on the titanium substrate further comprises:

drying the screen printed microwave absorbing material on the portions of the titanium substrate between the channels; and firing the screen printed microwave absorbing material to bond the layer of microwave absorbing material on the portions of the titanium substrate between the channels.

18. The method of claim 13, further comprising applying an anti-bonding material on the portions of the titanium substrate between the channels prior to the depositing of a layer of hydrogen getting material in the channels to prevent the layer of the hydrogen getting material from bonding to the portions of the titanium substrate between the channels.

19. The method of claim 13, further comprising preparing the channels for the depositing of a layer of hydrogen getting material on the channel floors and the channel walls.

20. The method of claim 13, wherein depositing a layer of the hydrogen getting material in the channels comprises:

depositing the layer of hydrogen getting material on floors and walls of the channels, as well as on the portions of the titanium substrate between the channels of the titanium substrate;

subsequently removing the layer hydrogen getting material from the portions of the titanium substrate between the channels;

bonding the layer of hydrogen getting material on the channel floors and the channel walls of the titanium substrate; and removing the layer of hydrogen getting material from the portions of the titanium substrate between the channels.

21. An Integrated Microwave Assembly (IMA), comprising:

a metal housing defining a cavity including walls for isolation and a lid for enclosing the cavity;

monolithic microwave integrated circuits (MMICs) for amplifying radio frequency (RF) signals propagating through the cavity in the metal housing;

the MMICs including hydrogen sensitive components comprising one or more of a High Electron Mobility Transistor (HEMT), a Metal Semiconductor Field Effect Transistor (MESFET) and a thin film resistor;

at least one single substrate hydrogen and microwave absorber located within the IMA metal housing for suppressing spurious radio frequencies and for absorbing excess hydrogen within the IMA.

22. The IMA of claim 21, wherein at least one single substrate hydrogen and microwave absorber located within the IMA metal housing further comprises:

a titanium substrate;

channels formed in the titanium substrate and spaced apart from one another by a predetermined distance;

a layer of microwave absorbing material formed on portions of the titanium substrate between the channels; and a hydrogen getting material formed in the channels of the titanium substrate.

23. The IMA of claim 21, further comprising one or more additional single substrate hydrogen and microwave absorbers located within the IMA metal housing for suppressing spurious radio frequencies and for absorbing excess hydrogen within the IMA.

* * * * *